(12) United States Patent
Piccardo et al.

(10) Patent No.: US 11,398,714 B2
(45) Date of Patent: Jul. 26, 2022

(54) WIDELY-TUNABLE HARMONIC FREQUENCY COMB IN A QUANTUM CASCADE LASER

(71) Applicant: PRESIDENT AND FELLOWS OF HARVARD COLLEGE, Cambridge, MA (US)

(72) Inventors: Marco Piccardo, Cambridge, MA (US); Dmitry Kazakov, Cambridge, MA (US); Federico Capasso, Cambridge, MA (US); Paul Chevalier, Somerville, MA (US)

(73) Assignee: PRESIDENT AND FELLOWS OF HARVARD COLLEGE, Cambridge, MA (US)

( * ) Notice: Subject to any disclaimer, the term of this patent is extended or adjusted under 35 U.S.C. 154(b) by 112 days.

(21) Appl. No.: 16/956,294

(22) PCT Filed: Dec. 20, 2018

(86) PCT No.: PCT/US2018/066934
§ 371 (c)(1),
(2) Date: Jun. 19, 2020

(87) PCT Pub. No.: WO2019/126573
PCT Pub. Date: Jun. 27, 2019

(65) Prior Publication Data
US 2020/0335947 A1    Oct. 22, 2020

Related U.S. Application Data

(60) Provisional application No. 62/697,246, filed on Jul. 12, 2018, provisional application No. 62/609,232, filed on Dec. 21, 2017.

(51) Int. Cl.
*H01S 5/34* (2006.01)
*H01S 5/065* (2006.01)
*H01S 5/30* (2006.01)

(52) U.S. Cl.
CPC .......... *H01S 5/3401* (2013.01); *H01S 5/0657* (2013.01); *H01S 5/305* (2013.01)

(58) Field of Classification Search
CPC .. H01S 5/0623; H01S 2302/02; H01S 5/0657; H01S 5/3401; H01S 5/305; H04B 10/90
(Continued)

(56) References Cited

U.S. PATENT DOCUMENTS 7,152,007 B2    12/2006 Arnone et al.
7,733,924 B2     6/2010 Wysocki et al.
(Continued)

FOREIGN PATENT DOCUMENTS

CN    104410463 A    3/2015

OTHER PUBLICATIONS

International Search Report and Written Opinion from corresponding International Patent Application No. PCT/US2018/66934, dated Jun. 25, 2019, 16 pages.
(Continued)

*Primary Examiner* — Tuan N Nguyen
(74) *Attorney, Agent, or Firm* — Foley & Lardner LLP

(57) ABSTRACT

A wireless communication device includes a quantum cascade laser (QCL) configured to generate a terahertz (THz) or microwave carrier signal. The QCL includes a laser waveguide, a laser optical gain medium incorporated in the laser waveguide, and at least one electrode. An antenna may be integrated with the electrode. The device may be a transmitter, the electrode configured to receive an input baseband signal, the QCL configured to couple the THz or microwave carrier signal and the input baseband signal into a THz or
(Continued)

microwave communication signal, and the antenna configured to transmit the THz or microwave communication signal. The device may be a receiver, the antenna configured to receive a THz or microwave communication signal, and the QCL configured to de-couple the THz or microwave communication signal from the THz or microwave carrier signal into an output baseband signal.

15 Claims, 11 Drawing Sheets

(58) Field of Classification Search
USPC .................................................. 250/370.12
See application file for complete search history.

(56) References Cited

U.S. PATENT DOCUMENTS

| | | | |
|---|---|---|---|
| 9,391,420 B2* | 7/2016 | Wanke | H01S 3/08036 |
| 2006/0153262 A1 | 7/2006 | Barbieri et al. | |
| 2016/0211578 A1 | 7/2016 | Ghelfi et al. | |
| 2016/0308331 A1* | 10/2016 | Belkin | H01S 5/34346 |
| 2017/0201072 A1 | 7/2017 | Kotani et al. | |

OTHER PUBLICATIONS

Invitation to Pay Additional Fees from corresponding International Patent Application No. PCT/US2018/66934, dated Mar. 4, 2019, 2 pages.
Kazakov, D., et al. "Self-starting harmonic frequency comb generation in a quantum cascade laser", Nature Photon 11, 789-792 (2017); arXiv 1709.02887v1 (physics.optics) (Sep. 9, 2017).

\* cited by examiner

WIDELY-TUNABLE HARMONIC FREQUENCY COMB IN A QUANTUM CASCADE LASER

CROSS-REFERENCE TO RELATED APPLICATIONS

This application is a National Stage Entry of International Application No. PCT/US2018/066934, filed on Dec. 20, 2018, which claims the benefit of and priority to U.S. Provisional Patent Application No. 62/609,232, filed on Dec. 21, 2017, and U.S. Provisional Patent Application No. 62/697,246, filed Jul. 12, 2018, each of which are incorporated herein by reference in their entirety.

STATEMENT OF FEDERALLY SPONSORED RESEARCH OR DEVELOPMENT

This invention is made with Government support under 1614631, awarded by National Science Foundation. The Government has certain rights in the invention.

BACKGROUND

Wireless communication systems can include a transmission unit and a reception unit. Each of the transmission unit and the reception unit includes a signal generator that creates a carrier frequency, a modulator and/or demodulator that mixes the carrier signal with the input/output data signal, and an antenna for transmitting and/or receiving the signal. The carrier frequency used for wireless communications has been increasing in order to accommodate the growing demand in data traffic. One reason for this increase in wave frequency is due to the linear scaling of the information capacity, or data rate, of a signal with its associated bandwidth.

A total bandwidth allocated by the U.S. Department of Commerce to channels operating at carrier frequencies below 100 GHz is below about 7-9 GHz. The limitation to the bandwidth sets a constraint on the capacity of said channels and can ultimately limit the channels to a level insufficient to meet the increasing demand for wireless communication. This limitation is one of the driving factors in the recent technological efforts for communication systems operating at higher carrier frequencies in the terahertz (THz) range (about 0.1-10 THz). Based on specific subsets of THz frequencies, different transmission distances can be achieved, ranging between about 0.1 m and about 10 km, based on atmospheric attenuation.

Certain comparative THz communication systems are based on either electronic or photonic approaches. Some comparative electronics-based systems utilize harmonic mixers as up-converters of radiofrequencies or high-speed transistors. For example, transceivers using Si-based electronics may achieve wireless links with bands up to about 260 GHz and about 10 Gbit/s data rate, while transceivers using GaAs/InP-based electronics may achieve frequency bands up to about 300 GHz with about 100 Gbit/s data rate.

Certain comparative photonics-based approaches, especially used in transmitters, rely on optical-to-THz conversion using photomixing and may achieve data rates up to about 100 Gbit/s for a single channel. The said photomixing process allows generating THz waves at the difference frequency of the heterodyned optical fields. The optical modes can be phase-locked in order to ensure low phase noise of the heterodyne signal, which is used as a THz carrier in the communication system. Some of those comparative photonic devices are based on semiconductor laser optical frequency comb generators that are phase-locked. The signal carrier frequency that can be generated using these frequency combs corresponds to the free spectral range (FSR) of the laser, which scales with the inverse of the cavity length. For example, semiconductor devices with lengths of few millimeters may achieve frequency bands of about 50 GHz. This can be overcome by optical filtering leading to an effectively larger comb spacing and signal carrier frequency, but with a drawback of reducing considerably the efficiency of the signal generator. Another challenge for certain comparative photonic systems for THz communications is that the processes of signal generation, modulation and transmission/reception occur in separate devices, leading to complicated composite systems.

SUMMARY

At least some embodiments of the present disclosure relate to a unibody device for THz or microwave communications based on a semiconductor laser, including a quantum cascade laser (QCL) that operates as a frequency comb generator. The device is called "unibody" in the sense that each transmission/reception unit of the communication system may include a single active device in which the carrier signal generation, modulation/demodulation and transmission/reception occur. Each active device may utilize a separate control unit for power supply and temperature stabilization. In some embodiments, the QCL may operate as a frequency comb generator in a harmonically-phase-locked regime. In some embodiments, the QCL may operate as a frequency comb generator in a fundamental comb regime and may attain large intermodal spacing for the generation of sub-THz carrier (e.g., in cases where the length of the cavity is suitable (e.g., short enough)).

Multiple nonlinearities of the QCL provide for the laser operating as a unibody signal generator and/or modulator. The strong third-order optical nonlinearity of the QCL provides for the laser operating in a harmonically-phase-locked regime and generating an optical spectrum with modes equidistantly spaced and separated by a frequency spacing in the THz range. An alternative configuration for the generation of a QCL comb with THz intermodal spacing involves the use of an ultra-short cavity and high-reflectivity (HR) facet coatings to lower the lasing threshold: for instance, a cavity about 250-μm long can produce an intermodal spacing of, e.g., about 181 GHz. Furthermore, the nonlinearity of the QCL (e.g., nonlinearity of the population inversion response to the intensity of the optical field (which may be, for example, dependent on the electric field squared)) provides for the laser photomixing the optical fields inside the laser cavity generating a THz carrier frequency for the communication system. In addition, the nonlinear electrical current-voltage characteristic of the QCL provides for the laser mixing the THz carrier frequency with an input baseband signal. The modulated passband signal is transmitted into free space from an integrated resonant THz antenna of the transmitter unit. In a similar, symmetric series of processes, the signal is coupled into the receiver through another integrated resonant THz antenna, and mixed inside the cavity with the THz carrier frequency produced inside a QCL of the receiver, which also operates in a QCL comb regime with a THz intermodal spacing. Thus, the receiver can retrieve the original baseband signal. The intermodal spacing for the QCL of the receiver may be equal or close to the intermodal spacing for the QCL of the transmitter. The optical frequency for the QCL of the receiver may be the same, or different from, the optical frequency for the QCL of the transmitter.

In one aspect of the present disclosure, an electronic device includes a QCL configured to generate a THz or microwave carrier signal based on intracavity beating of laser optical frequency modes of the QCL.

In some embodiments, the QCL includes a laser waveguide, a laser optical gain medium incorporated in the laser waveguide, and at least one electrode configured to receive an input baseband signal.

In some embodiments, the QCL is further configured to couple the THz or microwave carrier signal and the input baseband signal into a THz or microwave communication signal, and the electronic device further includes an antenna configured to transmit the THz or microwave communication signal.

In some embodiments, the QCL is configured to operate in a harmonically-phase-locked regime or in a fundamentally-phase-locked regime.

In some embodiments, the laser optical frequency modes are mid-infrared harmonic frequency combs.

In some embodiments, frequency spacing of the laser optical frequency modes is within a THz or microwave range.

In some embodiments, the free spectral range (FSR) of the QCL depends on a cavity length of the QCL.

In some embodiments, the laser waveguide and the laser optical gain medium of the QCL define a Fabry-Perot laser cavity.

In some embodiments, the antenna is a phase-array antenna integrated with the electrode of the QCL.

In some embodiments, the QCL further includes at least one facet optical coating.

In some embodiments, the electronic device further includes a laser control unit configured to control operation of the QCL.

In another aspect of the present disclosure, an electronic device includes an antenna configured to receive a terahertz (THz) or microwave communication signal, and a quantum cascade laser (QCL) configured to generate a THz or microwave carrier signal and to de-couple the THz or microwave communication signal from the THz or microwave carrier signal into an output baseband signal, the QCL including a laser waveguide, a laser optical gain medium incorporated in the laser waveguide, and at least one electrode configured to output the output baseband signal.

In some embodiments, the QCL is configured to operate in a harmonically-phase-locked regime or in a fundamentally-phase-locked regime.

In some embodiments, the THz or microwave carrier signal includes laser optical frequency modes equidistantly spaced and separated by a frequency spacing.

In some embodiments, the laser optical frequency modes are mid-infrared harmonic frequency combs.

In some embodiments, the frequency spacing corresponds to a higher harmonic of a free spectral range (FSR) of the QCL.

In some embodiments, the laser waveguide and the laser optical gain medium of the QCL define a Fabry-Perot laser cavity.

In some embodiments, the antenna is a phase-array antenna integrated with the electrode of the QCL.

In some embodiments, the QCL further includes at least one facet optical coating.

In some embodiments, the electronic further includes a laser control unit configured to control operation of the QCL.

In another aspect of the present disclosure, a communication system includes a transmitter device, including: a first quantum cascade laser (QCL) configured to generate a first THz or microwave carrier signal, the first QCL including a first electrode configured to receive an input baseband signal, wherein the first QCL is further configured to couple the first THz or microwave carrier signal and the input baseband signal into a THz or microwave communication signal, and a first antenna configured to transmit the THz or microwave communication signal. The communication system further includes a receiver device, including a second antenna configured to receive the THz or microwave communication signal, and a second QCL configured to generate a second THz or microwave carrier signal and to de-couple the THz or microwave communication signal from the second THz or microwave carrier signal into an output baseband signal, the QCL including a second electrode configured to output the output baseband signal.

In some embodiments, the first QCL or the second QCL is configured to operate in a harmonically-phase-locked regime or in a fundamentally-phase-locked regime.

In some embodiments, the first or the second THz or microwave carrier signal includes mid-infrared harmonic frequency combs with substantially equidistantly spaced modes, the frequency spacing corresponding to a higher harmonic of a free spectral range (FSR) of the first or the second QCL.

In some embodiments, a first frequency spacing of the first THz or microwave carrier signal is substantially equal to a second frequency spacing of the second THz or microwave carrier signal.

In some embodiments, the first or the second antenna is a phase-array antenna integrated with the first or the second electrode of the first or the second QCL.

In another aspect of the present disclosure, an electronic device includes: a first quantum cascade laser (QCL) configured to generate an optical seed, and a second quantum cascade laser (QCL) configured to couple an optical power of the optical seed into a cavity of the second QCL and to emit an output signal having a harmonic state, wherein a spacing of the harmonic state depends on a frequency of the optical seed.

In some embodiments, the frequency of the optical seed generated by the first QCL is different from a frequency of a first lasing mode of the first QCL.

In some embodiments, the second QCL operates below an instability threshold.

In some embodiments, the first QCL is an external-cavity QCL.

In some embodiments, the optical seed is a single mode signal generated by the first QCL in a continuous wave operation.

In some embodiments, the optical seed is focused at a first angle with respect to a normal to an anti-reflective facet of the second QCL.

In some embodiments, the first angle is larger than a half-divergence angle of the second QCL.

In some embodiments, the optical seed is focused at the first angle such that the output signal of the second QCL is prevented from destabilizing an operation of the first QCL.

In some embodiments, the electronic device further includes one or more optical components configured to focus the optical seed into the first angle.

In some embodiments, the one or more optical components include one or more off-axis parabolic mirrors.

In some embodiments, the second QCL is a Fabry-Perot QCL.

In some embodiments, a coupling efficiency of coupling the optical seed into the cavity of the second QCL depends on a relative detuning between the frequency of the optical seed and a nearest cavity mode of the second QCL.

In some embodiments, the electronic device further includes a collimator configured to collimate the output signal emitted by the second QCL.

In some embodiments, the collimator includes an off-axis parabolic (OAP) mirror.

In some embodiments, the electronic device includes a Fourier transform infrared spectrometer configured to measure an emission spectrum of the output signal.

In some embodiments, the first QCL is further configured to change the frequency of the optical seed that controls the spacing of the harmonic state of the output signal emitted by the second QCL.

In some embodiments, the first QCL is further configured to fine tune an amplitude of the optical seed to control generation of the harmonic state in the second QCL.

In some embodiments, the second QCL operates in a single mode regime or a multimode regime.

In some embodiments, the optical seed drives an evolution of a multimode field of the second QCL.

In some embodiments, the spacing of the harmonic mode matches a band of an atmospheric transmission window for wireless communication.

In another aspect of the present disclosure, an electronic device includes a quantum cascade laser (QCL) configured to generate a carrier signal based on intracavity beating of laser optical frequency modes of the QCL, the QCL including a laser waveguide, a laser optical gain medium incorporated in the laser waveguide, and at least one electrode configured to output an output baseband signal.

In some embodiments, the electronic device includes a contact pad adjacent to the QCL and configured to run a bias current thought the QCL.

In some embodiments, the carrier signal is a sub-THz signal.

In some embodiments, the electronic device includes a transmitter configured to transmit the sub-THz signal to a medical imaging device, and wherein the sub-THz signal is configured for medical imaging to penetrate tissue.

In some embodiments, the contact pad is wire bonded to the QCL.

In some embodiments, the contact pad is configured to function as a $\lambda/4$ stub at a beatnote frequency $f_B$ of the QCL, or as a $\lambda/2$ stub at $2f_B$.

In some embodiments, the electronic device further includes an antenna, wherein the antenna is configured to receive a locking signal at a selected power level or frequency, and the QCL is configured to generate a beatnote frequency that locks to the locking signal in a master-slave fashion.

In some embodiments, the QCL is configured for wireless tuning via the locking signal.

BRIEF DESCRIPTION OF THE DRAWINGS

For a better understanding of the nature and objects of some embodiments of this disclosure, reference should be made to the following detailed description taken in conjunction with the accompanying drawings.

DETAILED DESCRIPTION

In laser physics, spatial hole burning is a phenomenon which induces a population inversion grating in the active region of a standing-wave laser and leads to multimode operation. The beating of optical modes forming a frequency comb can lead to space-time dependent population inversion oscillations across a laser cavity at THz frequencies. Thus, a dynamic electronic grating produced inside a frequency comb generator can be exploited (e.g., rather than light emitted by it), greatly expanding frequency comb applications. This approach provides the quantum cascade laser with unconventional functionalities. For example, the mid-infrared quantum cascade laser can operate as a THz generator, modulator and detector for digital communications.

At least some embodiments of the present disclosure relate to chip-scale multifunctional devices to generate, transmit and/or receive high-spectral-purity, powerful THz signals for high-data-rate communications. The device includes a mid-infrared quantum cascade laser generating an optical frequency comb with a THz spacing between longitudinal modes. However, instead of (or in addition to) using light emitted from the laser as in comparative frequency combs, the intracavity beating of the optical modes is utilized to form the comb and to generate a THz signal at room temperature. The tunability, modulation and wireless extraction of such THz signals from the laser are conducted as a transmitter-receiver system for communication applications. The disclosed system demonstrates harmonic frequency comb operation in quantum cascade lasers and the beating dynamics of the optical modes inside the laser cavity. The disclosed systems make use of the nonlinear interactions between the lasing modes to transmit, modulate, and receive THz signals.

The disclosed THz transceiver is based on a single component (for each transmitter or receiver) and may deliver mW level high quality signals for various wireless communication applications. Applications of the disclosed system include: wireless connections in data centers, in smart offices and in smart homes, near-field communications such as kiosk downloading, device-to-device communications in the Internet of Things (IoT) and wireless backhauling of base stations in femtocells.

Figure 1:
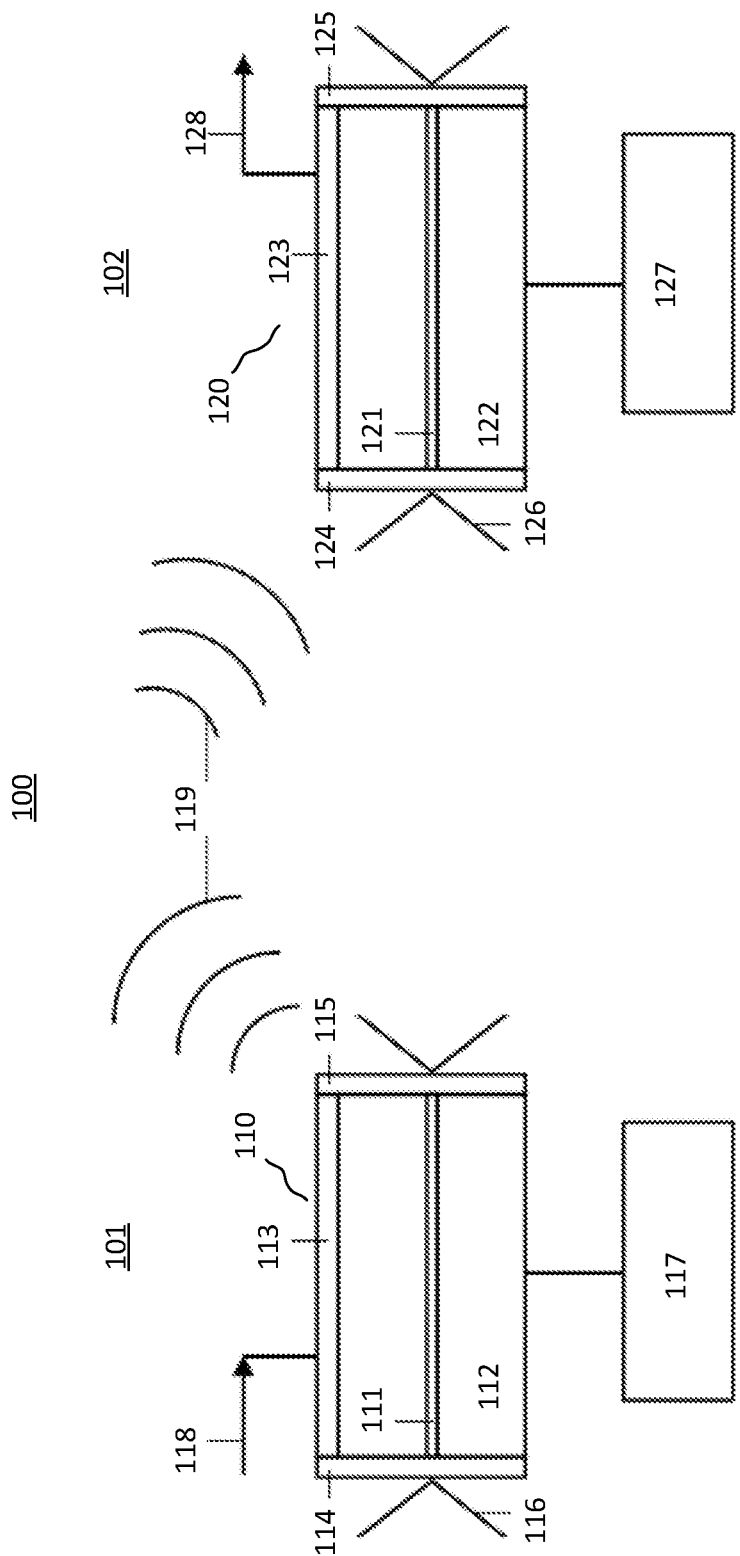
FIG. 1 illustrates a terahertz (THz) or microwave communication system using quantum cascade lasers (QCLs), in accordance with one or more embodiments.

FIG. 1 illustrates a THz or microwave communication system using quantum cascade lasers (QCLs). The THz communication system 100 operates for generation, transmission, and/or reception of communication signals in the terahertz (THz) frequency band. The THz communication system 100 includes a transmitter 101 and a receiver 102. The transmitter 101 includes a QCL 110. The QCL 110 is driven by a laser control unit 117. The QCL 110 may be a Fabry-Perot cavity including a laser optical gain medium 111 incorporated in a laser waveguide 112, that are coated by a left facet optical coating 114 and a right facet optical coating 115.

The QCL 110 operates in a frequency comb regime with a THz or microwave intermodal spacing and generates frequency comb laser output 116 as carrier frequency. The QCL 110 operates as a unibody THz carrier frequency generator and a signal modulator. The QCL 110 receives an input baseband signal 118 and mixes the input baseband signal 118 with the generated THz carrier frequency. The QCL 110 further includes an integrated phase-array antenna 113 for transmitting the mixed THz communication signal 119.

The receiver 102 includes a QCL 120. The QCL 120 is driven by a laser control unit 127. The QCL 120 may be a Fabry-Perot cavity including a laser optical gain medium 121 incorporated in a laser waveguide 122, that are coated by a left facet optical coating 124 and a right facet optical coating 125. The QCL 120 further includes an integrated phase-array antenna 123 for receiving the THz communication signal 119.

The QCL 120 operates in a frequency comb regime with a terahertz or microwave intermodal spacing and generates frequency comb laser output 126 as carrier frequency. The QCL 120 operates as a unibody terahertz carrier frequency generator and a signal demodulator. The QCL 120 receives the THz communication signal 119 and extracts the output baseband signal 128 via demodulation with the THz carrier frequency.

Figure 2:
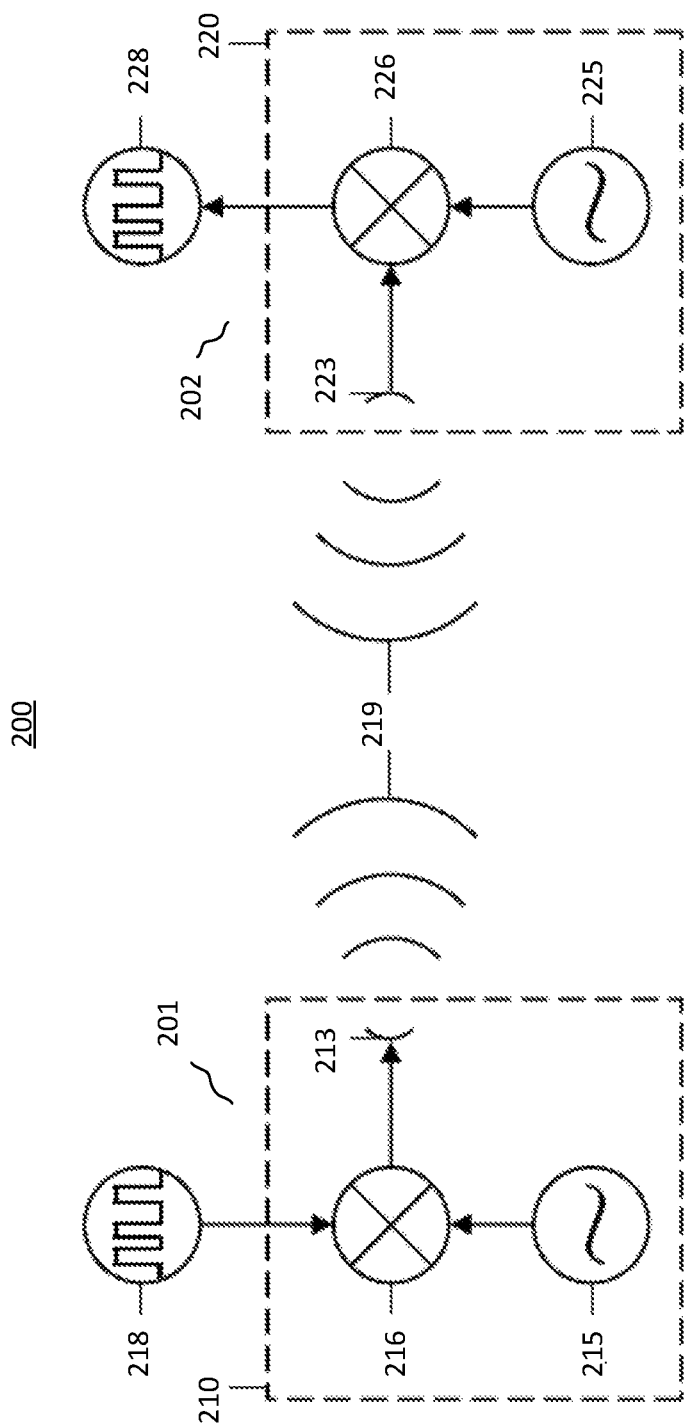
FIG. 2 illustrates QCLs of a THz or microwave communication system conducting various functions, in accordance with one or more embodiments.

FIG. 2 illustrates QCLs of a THz or microwave communication system conducting various functions. The THz communication system 200 includes a transmitter 201 and a receiver 202. The transmitter 201 includes a QCL 210. The receiver 202 includes a QCL 220.

The QCL 210 receives an input baseband signal 218. The QCL 210 operates as a THz carrier frequency generator 215. The QCL 210 further operates as a modulator 216 for mixing the input baseband signal 218 with the THz carrier frequency into a THz communication signal 219. The QCL 210 further includes an integrated phased-array antenna 213 for transmitting the THz communication signal 219.

The QCL 220 receives the THz communication signal 219 through the integrated phase-array antenna 223. The QCL 220 operates as a THz carrier frequency generator 225. The QCL 220 further operates as a demodulator 226 by extracting the output baseband signal 228 via demodulation with the THz carrier frequency.

According to at least some embodiments of the present disclosure, each of the transmitter and the receiver (also referred to as active devices) includes a QCL generating a comb of optical frequencies that are equidistantly spaced with a spacing corresponding to a higher harmonic of the free spectral range (FSR) of the laser (e.g., at least twice the FSR). The maximum intermodal spacing of such harmonically-phase-locked frequency comb may be set by the gain recovery frequency of the laser (e.g., at least about 1 THz). The geometry of the laser may be a Fabry-Perot cavity including an optical gain medium incorporated in an optical waveguide with two electrodes for electrical current injection. The geometry of the laser is such that the group velocity dispersion (GVD) of the laser is low, either positive or negative, with absolute values of, e.g., smaller than about 10000 $fs^2$/mm. A low GVD may lead to comb operation of the laser. In order to engineer the intermodal spacing of the harmonically-phase-locked frequency comb, and consequently the carrier frequency of the communication device, the facets of the laser cavity can be coated, for instance using anti-reflectivity or high-reflectivity coatings (e.g., 114, 115, 124 and 125 of FIG. 1), or left uncoated. A portion of the surface of the device may be patterned with metal structures forming an integrated phase-array antenna for THz wave transmission and/or reception. Different resonant THz antenna designs can be utilized, such as bowtie, grating, nanorod and patch antennas, as well as different extraction schemes centered on the top electrode or on the emitting facets of the laser.

Figure 3:
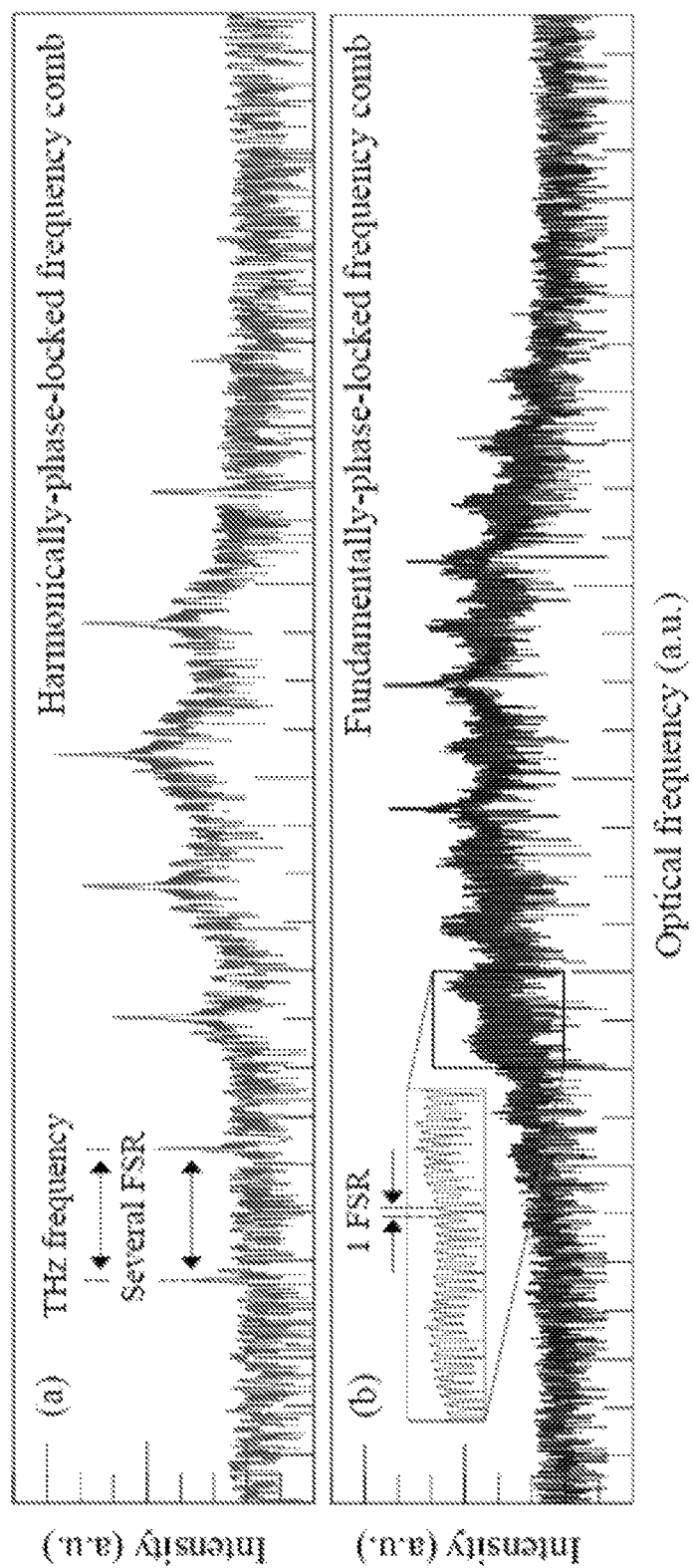
FIG. 3 illustrates spectral outputs of QCL frequency comb generators operating in two different regimes, in accordance with one or more embodiments.

FIG. 3 illustrates spectral outputs of quantum cascade laser frequency comb generators operating in two different regimes. As shown in part (a) of FIG. 3, the laser is in a harmonically-phase-locked regime and the modes of the frequency comb are separated by several free spectral ranges of the laser cavity. The spacing of the modes corresponds to a frequency in the THz range. As shown in part (b) of FIG. 3, the laser is in a fundamentally-phase-locked regime and the modes of the frequency comb are separated by 1 free spectral range.

Figure 4:
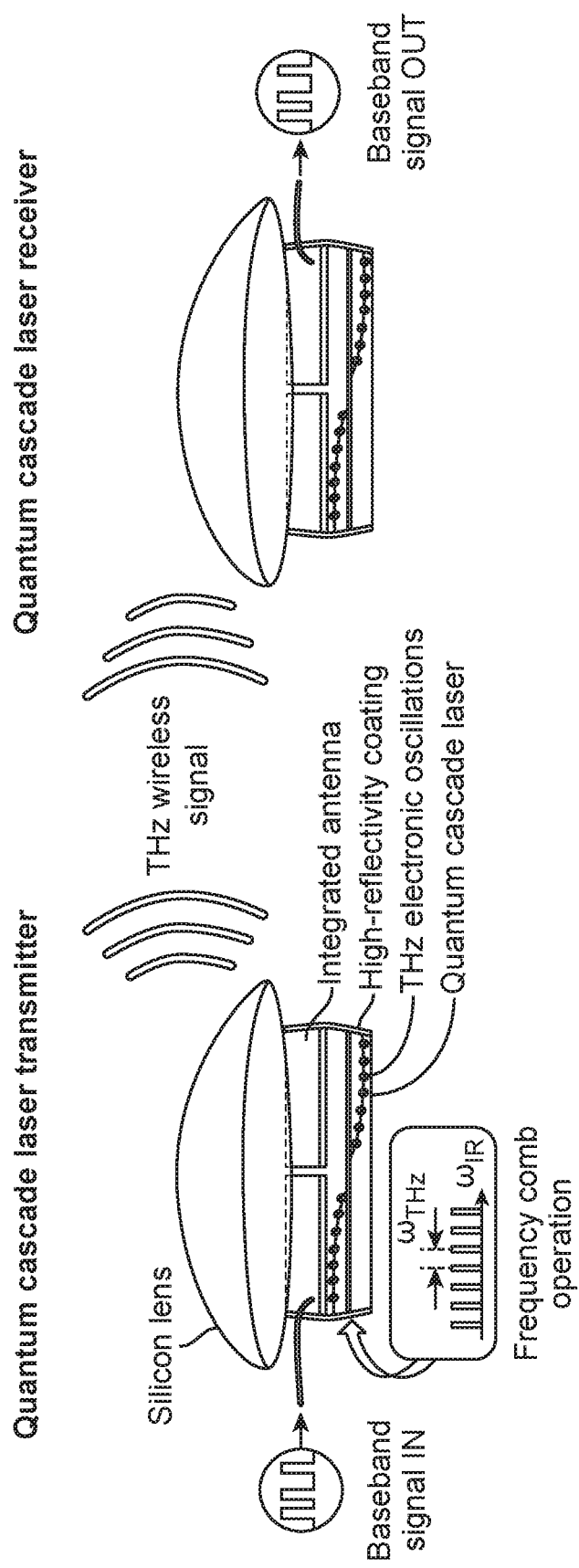
FIG. 4 illustrates a QCL transmitter and a QCL receiver for conducting THz wireless communication, in accordance with one or more embodiments.

FIG. 4 illustrates a quantum cascade laser transmitter and a quantum cascade laser receiver for conducting THz wireless communication. Each of the transmitter unit and the receiver unit includes a mid-infrared quantum cascade laser (QCL) operating in a frequency comb regime with a THz intermodal spacing. The beating of the optical modes inside the laser cavity produces electronic oscillations giving rise to a high-spectral-purity THz carrier frequency. High-reflectivity facet coatings increase the intracavity optical field minimizing optical losses in the mid-infrared. The laser can act as a frequency mixer due to its nonlinear I-V characteristic allowing a baseband communication signal injected inside the transmitter to be encoded on top of the THz carrier frequency. The top electrode of the laser is patterned to act as an integrated dipole antenna, as a portion of an integrated antenna, allowing the THz communication signal to be out-coupled into free space using a silicon lens. On the receiver end, the same type of device receives the THz signal and down converts the THz signal to the baseband signal, allowing retrieving the original communication signal.

The operations of the quantum cascade laser (QCLs) transmitter and the QCL receiver are explained as follows.

A QCL can operate as a coherent source of mid-infrared (mid-IR) harmonic frequency combs with an intermodal spacing lying in the sub-THz or THz band. The beating of the optical modes of the high-power mid-IR harmonic frequency comb can be utilized to generate intracavity THz radiation, with the benefit of room temperature and continuous wave operation without a need of cryogenic cooling. Due to the extremely fast gain recovery time (about picosecond) in QCLs associated with the relaxation time of intersubband transition, above a current threshold the single mode emission is destabilized and the spectrum develops a sideband corresponding to a mode of the cavity separated by multiple free spectral ranges. Then stimulated emission at the sideband occurs, followed by four-wave mixing between the two modes which results in the creation of a broad THz-spaced comb. This effect is a result of the population nonlinearity in which electronic population inversion oscillations develop at a frequency difference comparable to the inverse gain recovery time. The THz population oscillations give rise to current oscillations that can be coupled to the outgoing or incoming radiation by a suitable antenna integrated with the device (e.g., 113, 123 in FIG. 1).

From this perspective, the mid-IR light emitted by the laser can be a byproduct of comb operation which can be suppressed by high-reflectivity (HR) facet coatings, while the core element of the device is the dynamic electronic grating oscillating at THz frequencies inside the active region of the laser induced by the intracavity beating of the optical modes. Moreover, the spacing of the harmonic comb can be tuned in a single QCL over a large range of frequencies, e.g., between about 0.3 and about 1.3 THz, by means of optical injection seeding. Therefore the laser can act as a widely-tunable THz generator, benefitting from high spectral purity due to the comb nature of light that generates the THz carrier frequency, leading to a sub-kHz linewidth. This effect, alongside the nonlinear I-V characteristic of the laser which allows it to act as a frequency mixer, allows using the laser as a THz modulator (or demodulator), to encode a baseband input signal injected through the top electrode of the laser on top of the THz carrier frequency. Integration of a resonant antenna on the top electrode of the device can be used to efficiently out-couple the THz current modulation into a THz signal irradiated into free-space through, e.g., a silicon lens. One of the advantages is that there is no need of phase matching and complex extraction schemes.

In some embodiments, based on an estimate of the fraction of modulated current inside the laser due to the intermodal beating, and assuming a resonant dipole antenna, a system may achieve irradiated power in the range of, e.g., from about 0.1 to about 1 mW, which is sufficient for certain practical applications. Assuming an input electrical power of 1 W for the QCL (note that the laser current threshold will be lowered in presence of HR/HR coatings), the power efficiency of the THz source is expected to reach $10^{-4}$-$10^{-3}$, which is orders of magnitudes larger than comparative approaches based on difference frequency generation (DFG) or photomixing in photoconductive antennas (about $10^{-6}$-$40^{-5}$). In a symmetric series of processes, the THz signal can be coupled into the QCL receiver through an integrated antenna, mixed inside the cavity with the THz carrier frequency produced inside the laser, also operating in the harmonic comb regime with the same THz intermodal spacing of the QCL transmitter, allowing retrieving the original baseband signal. Thus, the QCL can be used in a monolithically-integrated device for the generation, modulation/demodulation and wireless transmission/reception of high-spectral-purity, powerful and tunable THz communication signals.

Figure 5:
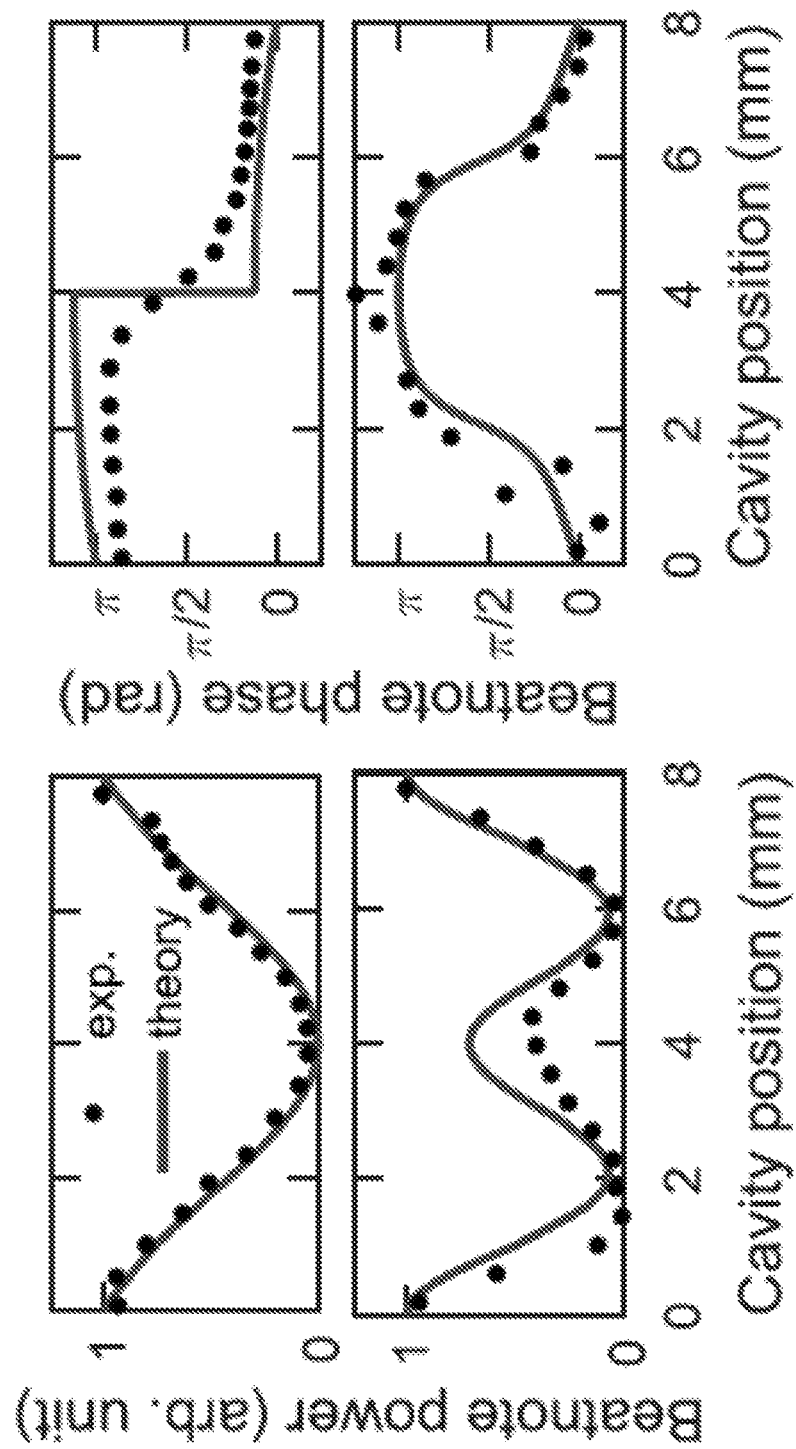
FIG. 5 illustrates a beat spatial hole burning (BSHB) effect for a QCL, in accordance with one or more embodiments.

FIG. 5 illustrates a beat spatial hole burning (BSHB) effect for a QCL. Power and phase of the intracavity beat profiles are measured on a QCL (shown as circles) at $f_B$ (top row) and $2 f_B$ (bottom row). Also shown are the predictions of a theoretical model of beat spatial hole burning (BSHB) (shown as continuous lines). The patterns of FIG. 5 exhibit antinodes at the edges of the cavity and a number of nodes equal to the order of the intermodal beatnote. The corresponding phase profiles show a smooth phase transition between 0 and π at the positions of the power nodes, indicating that adjacent lobes of the power profiles oscillate in antiphase.

In a symmetric Fabry-Perot laser with cavity length L, facet reflectivity R and unsaturated gain coefficient g=1/L log(1/R), the cavity mode m is in general a partial standing wave characterized by an amplitude $A_m$, a spectral phase $\phi_m$, a wavevector $k_m = \pi m/L$ and an angular frequency $\omega_m = ck_m/n_w$, $n_w$ being the effective refractive index of the waveguide. A total intracavity field intensity obtained by summing the contributions of all N lasing modes will contain not only static terms producing spatial hole burning (SHB) but also components oscillating at the beat frequencies inducing BSHB. By expanding the total intracavity intensity in a Fourier series and spatial low-pass filtering, the spatiotemporal dependence of the component oscillating at the $n^{th}$ harmonic of $f_B$ is $$I_{B,n} = \sum_{m=1}^{N-n} A_m A_{m+n}[\cos(nk_B x + n\omega_B t + \Delta\phi_{m+n,m})e^{-gx} + \cos(nk_B x - n\omega_B t - \Delta\phi_{m+n,m})e^{-g(L-x)}] \quad (1)$$

where $k_B$ and $W_B$ are determined by the difference of wavevectors and angular frequencies, respectively, of any pair of adjacent modes. By means of stimulated emission and absorption the spatiotemporal variations of the field intensity described by Eq. 1 directly translate into variations of the population inversion, provided that the gain recovery dynamics of the laser is fast enough, ultimately modulating the vertical current flowing in the device.

In an ideal frequency modulated (FM) laser the terms present in Eq. 1 may cancel out in the case of odd-order beat-notes ($f_B$, $3 f_B$, . . . ) because of the FM phase relationship among the modes enclosed in the $\Delta\phi_{m+n,m}$ terms. However, because of the asymmetry of the spectral amplitudes present in real FM lasers, a residual of these contributions may persist. To consider the case of a perfect standing wave cavity (R=1) as Eq. 1 becomes $$I_{B,n} = \sum_{m=1}^{N-n} A_m A_{m+n}\cos(nk_B x)\cos(n\omega_B t + \Delta\phi_{m+n,m}) \quad (2)$$

The standing-wave character of BSHB is evident and the spatial and temporal dependence of population pulsations inside the laser are intimately linked. The predictions of the analytical model presented here are shown in FIG. 5.

Figure 6:
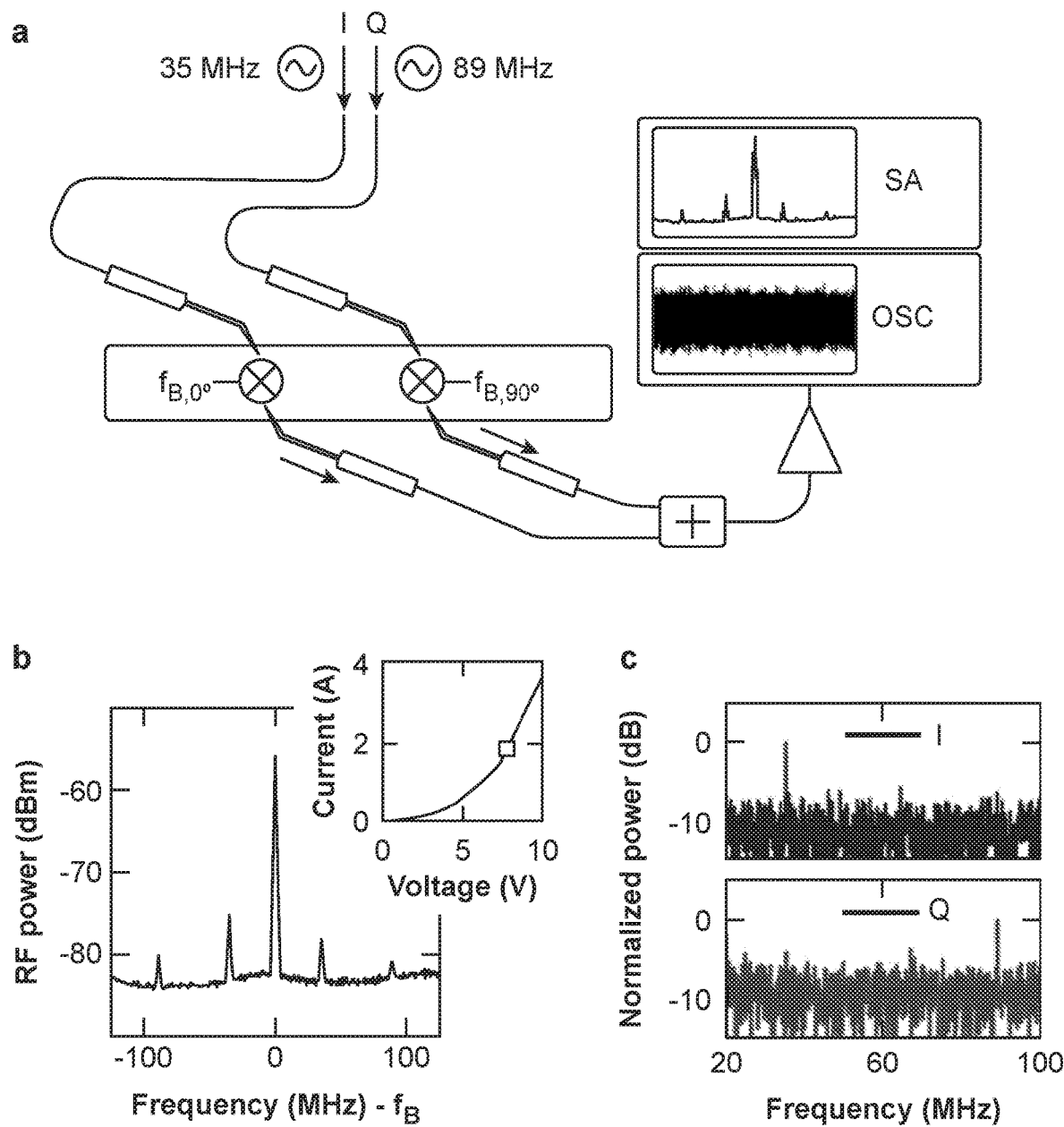
FIG. 6 illustrates quadrature amplitude modulation (QAM) based on the BSHB effect of a QCL, in accordance with one or more embodiments.

The effect of BSHB may provide a laser with unconventional functionality. FIG. 6 illustrates quadrature amplitude modulation (QAM) based on the BSHB effect of a QCL. Part a of FIG. 6 shows a schematic of a set-up used to demonstrate RF QAM with a mode-locked QCL. Two sinusoidal signals are injected and electrically mixed inside the laser with intermodal beatnotes offset by 90 degrees, producing in-phase (I) and quadrature (Q) signals. The modulation products are extracted by two additional RF probes, recombined using a power splitter and recorded on the oscilloscope (OSC) or spectrum analyzer (SA).

Part b of FIG. 6 shows an RF spectrum of the signal extracted from the QCL and measured with the SA. The inset shows the current-voltage curve of the device and the operating point for QAM (shown as square). Part c of FIG. 6 shows demodulated RF spectra of the I and Q channels retrieved after digital processing of the time-domain QAM waveform.

The measurement of BSHB shows that a laser can essentially operate as an array of integrated mutually coherent radio frequency (RF) oscillators with variable phase delays. Simultaneously, QCLs can multiply RF signals due to the diode nature of their current-voltage curve (as shown in inset of part b of FIG. 6) and thus operates as an RF mixer. This allows RF quadrature amplitude modulation (QAM) at a carrier frequency of, e.g., about 5.6 GHz with a mode-locked QCL operating as an I/Q modulator where the local oscillator (LO) signal is generated internally.

As a demonstrative example, two single frequency tones (about 35 and about 89 MHz) as baseband I and Q signals modulating the in-phase and quadrature components of the QCL beatnote. The I and Q signals are injected through the top electrode of QCL (shown in part a of FIG. 6) at positions where the phase difference between the local intermodal beat notes of the laser at $f_B$ is 90 degrees. The resulting in-phase and in-quadrature modulated carriers are extracted with two additional RF probes and combined producing the QAM spectrum shown in part b of FIG. 6. The corresponding QAM waveform is recorded with a mixed-signal oscilloscope for online processing. After numerical coherent quadrature demodulation, the retrieved the baseband spectra show that the I and Q channels are decoupled (shown in part c of FIG. 6) and confirming that the QCL operates as a quadrature modulator owing to the dynamics of BSHB. In some embodiments, further system optimization can allow high-bandwidth digital QAM with even larger constellations.

The modulation (or demodulation) functionality can be achieved by any passively phase-locked QCL and can be extended to higher carrier frequencies, for example by reducing the cavity length. Moreover, because of self-starting harmonic mode locking in QCLs where the intermodal spacing lies in the THz frequency band, the modulation/demodulation functionality can be used to generate and modulate submillimeter carriers. BSHB thus allows quadrature modulators that become the backbone of the high-speed THz wireless communication architectures.

Tuning Spacing of Harmonic Frequency Comb Based on Optical Injection Seeding

One of the challenges posed by the THz region in terms of wireless transmission of communication signals is the significant level of atmospheric attenuation induced by a large number (e.g., thousands) of roto-vibrational absorption lines of atmospheric gases in the range. Therefore, in order to use a THz wireless communication system in outdoors applications, it is desirable to operate the communication system at THz frequencies where atmospheric attenuation is minimal.

A QCL operating in the harmonic regime can be used as a source of THz frequencies based on the beating of the optical modes of the comb. At least some embodiments of the present disclosure describe a technology for tuning such THz carrier by modifying the intermodal spacing of the harmonic frequency comb.

An optical seed signal generated by a single-mode tunable source can be injected inside the cavity of the QCL, which is operated above the lasing threshold. Tuning the injection strength of the seed can cause the injected QCL to evolve into a harmonic comb. In the harmonic comb, the central mode corresponds to the main peak of the QCL spectrum before injection, one of the first-order sidebands lies close to the frequency of the injected seed, and other sidebands are produced by nonlinear four-wave-mixing interactions inside the laser.

By varying the frequency of the optical seed generated with the tunable source, the spacing of the harmonic state of the injected QCL can be changed. This is equivalent in certain regards to skipping a different number of free spectral ranges between the lasing modes of the QCL operating in the harmonic state. This scheme illustrates the flexibility of the disclosed platform to perform as a widely-tunable THz generator. Such a platform can perform as a reconfigurable and dynamically adapted THz source according to the length of the communication link and to the specific atmospheric conditions.

According to at least some embodiments of the present disclosure, self-starting harmonic frequency combs in quantum cascade lasers exhibit skipping of several tens of longitudinal modes of the cavity, producing widely-spaced frequency combs which may be used for a number of applications, such as the generation of high-spectral-purity microwave and terahertz tones. Under pure electrical injection, the spacing of such combs may be fixed by fundamental laser parameters and can hardly be controlled. In contrast, harmonic frequency combs in quantum cascade lasers can be induced by optical injection of an external seed provided by a tunable source. This scheme enables wide tunability of the harmonic comb spacing, allowing skipping longitudinal modes (e.g., from about 44 to about 171) in a single device.

Optical frequency combs in quantum cascade lasers (QCLs) have been developed into a competitive technology for spectroscopy applications in the mid-infrared range. Such QCL frequency combs are characterized by a spacing between longitudinal modes of one free spectral range (FSR), which is fixed by the device properties, namely by the length of the cavity and effective group index of the waveguide. A different type of QCL comb is based on a new laser regime—the harmonic state—originating from a single mode instability transferring energy from the first lasing mode to optical sidebands separated by roughly the Rabi frequency of the primary mode. The relative magnitudes of the Rabi frequency and the FSR in QCLs are such that the comb spacing corresponds to several multiples of the FSR. The harmonic comb formation is caused by a third-order optical nonlinearity and is reminiscent of mode proliferation in optically pumped microresonators.

The self-starting nature of harmonic combs in QCLs allows to generate widely-spaced combs by injection of electrical current in the device. The spacing of such combs is defined by fundamental parameters of the laser active region, namely the gain recovery time and dephasing time, in addition to the geometry of the cavity. However, fabricating a device with precise values of such parameters for a deterministic design of the comb spacing is a daunting task, which would specify band structure and dispersion engineering. Moreover, such approach based on fundamental laser design does not allow an active control of the number of skipped cavity modes in an operating device. As disclosed hereby, by means of optical injection seeding, harmonic states with a wide range of spacings can be generated from a single device, e.g., between about 0.34 and about 1.32 THz (corresponding to about 44 and about 171 FSRs, respectively). The achieved tunability can be used in a number of applications, such as the ones utilizing the coherent beats among the modes to produce spectrally pure tones at the frequency of the comb intermodal spacing, and others for access to individual comb lines, e.g. arbitrary optical and microwave waveform generation.

In some embodiments, the disclosed device can be a continuous wave, buried heterostructure, Fabry-Perot (FP) QCL emitting at a central wavelength of, e.g., about 4.5 mm and having a long cavity of, e.g., about 6 mm, an about 5 mm width waveguide, a high-reflectivity (HR) coating on the back facet (R≈1) and an anti-reflective (AR) coating on the front facet (R≈0.01). The FSR of the device is, e.g., about 7.7 GHz. The QCL is driven with a low-noise current driver (e.g., Wavelength Electronics QCL LAB 2000) and its temperature is stabilized at about 16° C. using a low-thermal-drift temperature controller (e.g., Wavelength Electronics TC5) with typical fluctuations smaller than about 10 mK. The spectral evolution of this laser in free-running mode can be a function of the injected current, a transition from the single-mode regime to the sparsely populated harmonic state, and eventually at high current to a dense state, where adjacent cavity modes are populated. Upon pure electrical injection the harmonic comb generated by this device may exhibit a spacing of, e.g., approximately 350 GHz.

As disclosed, the formation of the harmonic state can be triggered by a photon spontaneously emitted at a different frequency with respect to that of the first lasing mode. This induces a beat note, i.e. an intensity modulation at the difference frequency of the two fields, and results in a parametric contribution to the gain of the spontaneous photon. At a pumping level known as the instability threshold, this parametric gain can allow two harmonic sidebands to overcome the losses and start lasing. The harmonic state can also be induced by the injection of an optical seed in the laser cavity, while the device is operated below the instability threshold.

Figure 7:
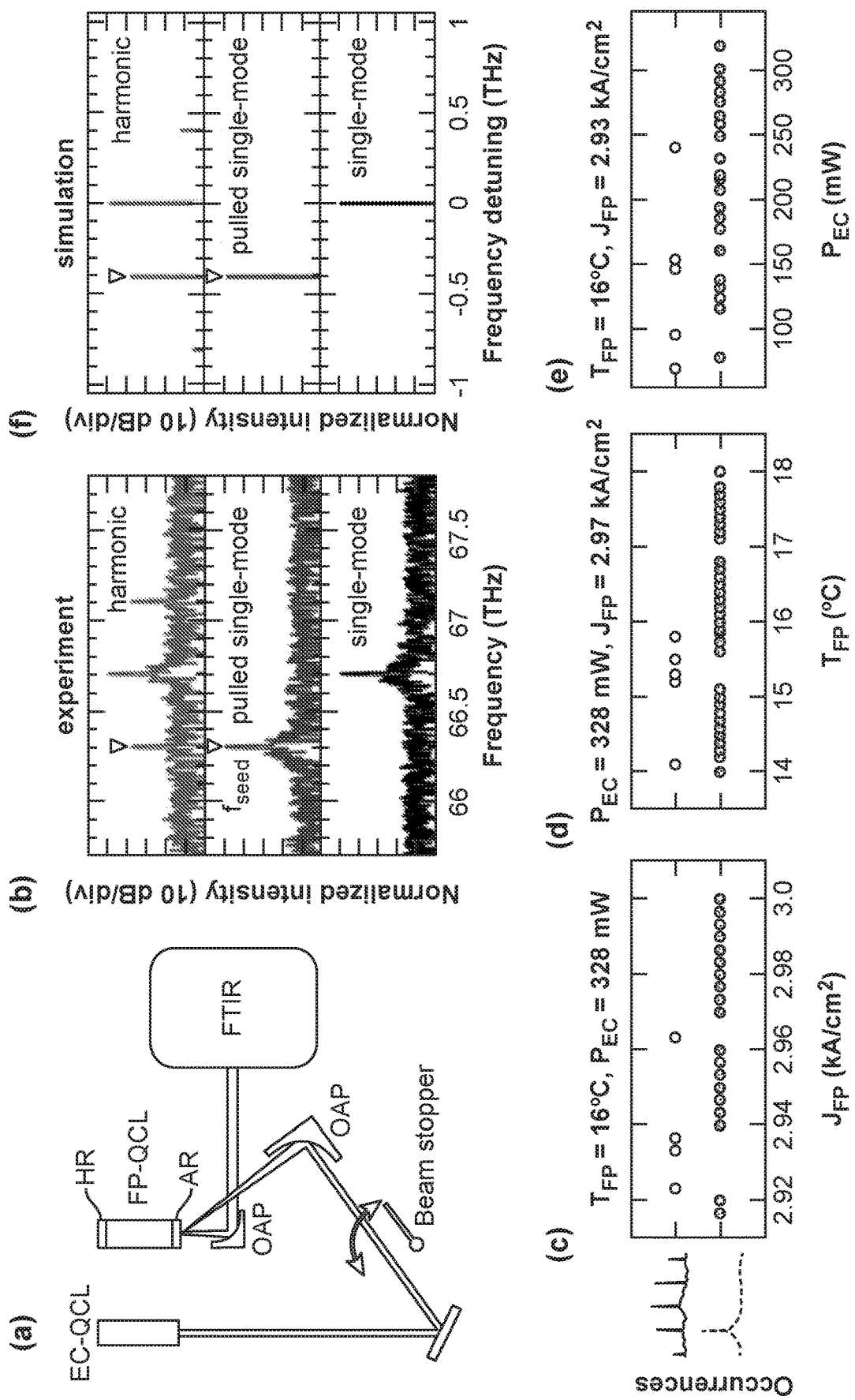
FIG. 7a schematically illustrates an experimental set-up used to induce harmonic comb operation in a Fabry-Perot quantum cascade laser by injection of an optical seed generated from a tunable single-mode laser, in accordance with one or more embodiments.
FIG. 7b illustrates experimental optical spectra prior to and upon optical injection, in accordance with one or more embodiments.
FIGS. 7c-7e illustrate occurrences of the two different types of state as JFP, TFP or PEC are varied, in accordance with one or more embodiments.
FIG. 7f illustrates space-time domain simulations of the QCL spectral evolution before and upon injection of an optical seed, in accordance with one or more embodiments.

FIG. 7a schematically illustrates an experimental set-up used to induce harmonic comb operation in a Fabry-Perot quantum cascade laser by injection of an optical seed generated from a tunable single-mode laser. EC-QCL represents an external cavity quantum cascade laser; FP-QCL represents a Fabry-Perot quantum cascade laser; HR represents a highly-reflective facet; AR represents an anti-reflective facet; OAP represents an off-axis parabolic mirror; FTIR represents a Fourier transform infrared spectrometer.

FIG. 7b illustrates experimental optical spectra prior to and upon optical injection. The bottom curve shows that prior to optical injection the FP-QCL operates in the single mode regime. Upon injection of an optical seed (at a frequency marked by arrowheads) the laser can evolve into a frequency-pulled single mode (represented by the middle curve) or a harmonic state (represented by the top curve). The specific evolution depends on the following parameters of, e.g., FP-QCL current density (JFP) and temperature (TFP), and incident EC-QCL seed power (PEC).

FIGS. 7c-7e illustrate occurrences of the two different types of state as JFP, TFP or PEC are varied.

FIG. 7f illustrates space-time domain simulations of the QCL spectral evolution before and upon injection of an optical seed. Before optical injection, the laser operates in the single mode regime (represented by the bottom curve) and the amplitude of the reflected electric field at the AR facet of the laser is about 1.2 kV/cm. When the amplitude of the injected seed overcomes a threshold of about 0.7 kV/cm a frequency-pulled single mode is produced (represented by the middle curve), while smaller amplitude values result into a harmonic state (represented by the top curve, seed amplitude of about 0.2 kV/cm). The frequency detuning can defined with respect to the frequency of the free-running single mode.

A schematic of the set-up is shown in FIG. 7a. The source of the optical seed is an external-cavity (EC) QCL (e.g., Daylight Solutions, model 41045-HHG) generating a single mode in continuous wave operation with a linewidth of, e.g., 100 MHz. The seed is focused at an angle of 34° with respect to the normal to the AR facet of the FP-QCL, chosen to be larger than the half-divergence angle of the laser under injection. This configuration allows for the coupling of a fraction of the optical power of the seed into the cavity of the FP-QCL, while preventing the output of the latter to destabilize the operation of the EC-QCL, thus acting as an effective optical isolator. The coupling of the optical seed into the FP cavity depends on the relative detuning between the seed frequency and the nearest FP cavity mode, which can be varied by acting on different experimental parameters. The value of maximum coupling efficiency (e.g., close to zero detuning) is estimated to be, e.g., about 1.25%. The light emitted from the FP-QCL under injection is collimated by an off-axis parabolic mirror, and its emission spectrum is measured using a Fourier transform infrared spectrometer.

Prior to optical injection, the FP-QCL operates in the single mode regime (see FIG. 7b, bottom). Injecting an optical seed detuned by, e.g., about 400 GHz with respect to the single mode frequency can induce the laser to evolve into either of two different states, a frequency-pulled single mode or a harmonic state (see FIG. 7b, middle and top). In the first case, the frequency of the pulled single mode coincides with that of the seed. In the other case, the central mode coincides with the single mode of the free running laser, while a sideband occurs at the frequency of the injected seed and another, symmetric sideband is produced by four-wave mixing (FWM). The specific spectral evolution of the laser under optical injection depends on a number of experimental parameters.

As shown in FIGS. 7c-7e, varying any of the quantities among FP-QCL current, FP-QCL temperature and seed power can produce the two different types of states. (In few instances merely a weak sideband at the seed frequency is produced, apart from which the laser state remains essentially identical to the initial single mode.) All these parameters can produce a change in the group refractive index of the waveguide of the FP-QCL—either by changing its temperature directly (FP-QCL temperature) or by Joule heating (FP-QCL current), or by means of optical absorption (seed power). As a consequence, the FP modes of the cavity can be shifted with respect to the fixed frequency of the optical seed, varying the seed coupling into the cavity and affecting the spectral evolution of the laser.

In a linear tuning regime one may expect a periodic alternation among the different states as the parameters are progressively varied, due to the nearly uniform spacing of the cavity modes. However, the aperiodicity observed in the experiments (see FIGS. 7c-7e) suggests that the interaction of the seed with the cavity modes is highly nonlinear, thus leading to a quasi-chaotic sequence of resulting laser states.

To investigate the mechanism determining the spectral evolution of the FP-QCL under optical injection in a more controlled framework, simulations of the experiment based on a space-time domain model of transport and recombination in the QCL active region can be performed. It is found that when the amplitude of the coupled seed overcomes a threshold of about 0.7 kV/cm (corresponding to a coupled power of about 0.5 mW)—a value comparable to that of the FP-QCL mode reflected at the AR facet (about 1.2 kV/cm)—a frequency-pulled single mode is obtained (see FIG. 7f, middle). The existence of a threshold is characteristic of an injection locking process. On the other hand, for smaller values of seed amplitude a harmonic state is observed, resulting from the amplification and mixing of the seed with the central mode of the FP-QCL (see FIG. 7f, top, seed amplitude: 0.2 kV/cm).

Notably, the transient of the laser reveals that even for large values of the seed amplitude a harmonic state initially starts forming, but after a time interval of only few tens of roundtrips the seed amplification is so strong that its amplitude overcomes that of all other modes, resulting in a frequency-pulled single mode state. These results indicate that fine tuning the amplitude of seed power coupled into the FP-QCL cavity may control the generation of a harmonic state by optical injection. In addition, both in experiments and simulations, the change of the laser state upon optical injection is reversible: turning off the seed sets the laser back into the initial single mode state, indicating that seed amplification is necessary to maintain the induced laser state.

In some embodiments, the harmonic comb spacing can be tuned by means of optical injection over a large frequency range, much beyond the intrinsic values. Moreover it is possible to induce a harmonic state not only in the case of a QCL operating in the single mode regime at low current, but also starting from a dense multimode regime at high current, with the clear advantage of a larger optical output power. For example, the FP-QCL can be driven in free-running mode at high current, where the optical output power is around 1 W and a dense state is produced with cavity modes separated by 1 FSR (see FIG. 8, bottom). The injection of an optical seed destabilizes the multimode state. This can be understood as the result of a competition between the seed and the lasing modes for the extraction of gain from the active medium of the laser.

By tuning the power of the incident optical seed, a variety of laser states can be produced inside the FP cavity, including the harmonic state. Its formation may be explained as follows. The seeded mode has both a running-wave and a standing-wave component inside the HR/AR cavity of the FP-QCL. The seeded mode depletes the gain of all laser modes, either by consuming the population inversion at all spatial locations along the cavity with its running-wave component or by FWM processes, which extract energy from the lasing modes. Upon appropriate tuning of the seed power, all modes of the dense state may become suppressed except the dominant one, which has access to more gain than other modes and is thus more stable. FWM between the dominant peak and the amplified seed results in the formation of a harmonic comb.

Figure 8:
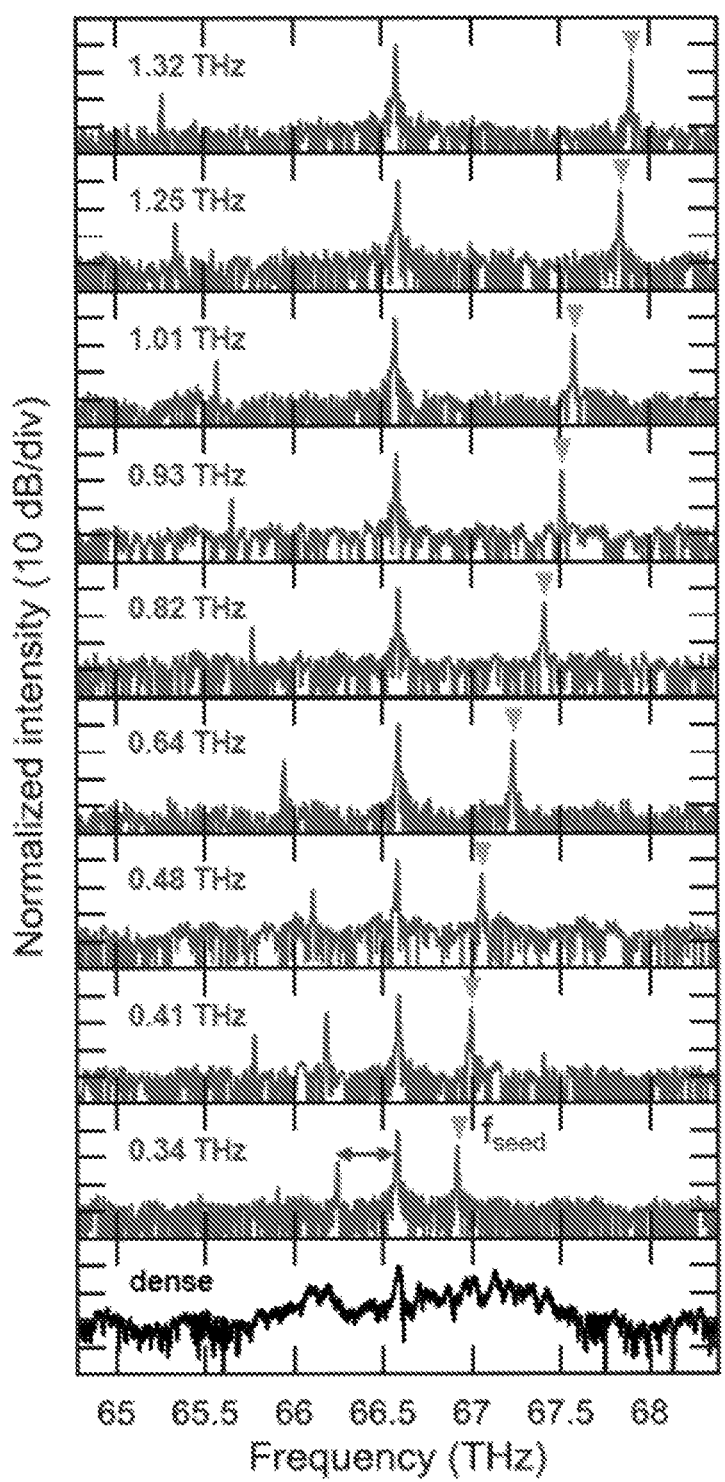
FIG. 8 illustrates optical spectra emitted by the FP-QCL before and after optical injection of seeds at different frequencies, in accordance with one or more embodiments.

FIG. 8 illustrates optical spectra emitted by the FP-QCL before and after optical injection of seeds at different frequencies. The bottom curve corresponds to the optical spectrum emitted by the FP-QCL before the optical injection of seeds. Other curves correspond to the optical spectra emitted by the FP-QCL after the optical injection of seeds at various frequencies. Thus, FIG. 8 shows tuning the harmonic comb spacing in an optically seeded quantum cascade laser. The FP-QCL is operated at a current density of, e.g., about 3.59 kA/cm$^2$. By varying the seed frequency (marked by arrowheads) the harmonic comb spacing can be varied between, e.g., about 0.34 and about 1.32 THz, corresponding to about 44 and about 171 FSRs, respectively.

To demonstrate the tunability of the comb spacing enabled by this approach, FIG. 8 shows a series of spectra recorded from the injected FP-QCL exhibiting spacings between about 0.34 THz and about 1.32 THz, corresponding to about 44 and about 171 FSRs, respectively. The values of the spacings may be chosen to match the bands of the atmospheric transmission windows lying in the lower terahertz (THz) band, where THz sources for the future ultrafast wireless communication devices are expected to operate. The specifications of the tuning range of the harmonic comb spacing are set by the intrinsic properties and physics of the FP-QCL. An upper limit is given by the gain bandwidth of the laser, while a lower limit—very close to the spacing of self-starting harmonic combs observed in the device in free-running mode—is attributed to the nature of the parametric gain, which tends to suppress low frequency modulations.

For comparison with other systems, FWM has also been used in quantum cascade amplifiers, where all the optical sources are external and include two injected beams performing as the pump and signal for the FWM process. One advantage of the scheme disclosed herein is that an electrically injected FP-QCL is utilized, providing an internal source of optical power for FWM, while the injected optical beam performs as a relatively weak seed allowing to drive the evolution of the multimode field.

Another system where harmonic frequency comb generation with a THz spacing is represented by optically-pumped high-Q micro-ring resonators. By dual-pump schemes in such micro-cavities, wide harmonic combs with tens of skipped cavity modes can be generated, exhibiting spacings between about 0.29 and about 2.25 THz (corresponding to about 6 and about 46 FSRs, respectively). In the case of microresonators, particular care may be taken to stabilize the frequency comb generation in order to eliminate or substantially reduce the locking instability arising between the external pump and the cavity resonances—a complication that may be avoided using optically injected QCLs disclosed herein.

The optical injection schemes disclosed herein provide for exploiting the harmonic state of QCLs, enabling a controlled variation of a number of skipped or underused longitudinal modes in the laser. This approach, including the use of an optical seed to drive parametric oscillations of the QCL, evocates the operation of microresonators, further highlighting the deep connection between the two comb platforms. By exploiting the beating of the comb modes, harmonic frequency combs in QCLs may be used as tunable, coherent microwave and THz sources characterized by high-spectral-purity and room temperature operation.

Contact Pad and Suppression of Intermode Beatnote

Some embodiments provide for contact pads configured to suppress intermode beatnotes of a laser (e.g., a QCL, such as a Fabry-Perot laser). The suppression may be provided for beatnotes of any selected order. Certain configurations (e.g., including geometries) of a contact pad disposed adjacent to or near to the laser and used to run bias current through the laser can help to suppress the intermodal beatnote locally inside the laser cavity. This effect can have direct implications on the laser's dynamics. For example, in such a configuration the laser may be operated in a harmonic frequency comb regime, such as a regime characterized by skipping of FSRs (e.g., instead of the fundamental frequency comb regime with modal spacing set based on the cavity length). This may allow more stable operation in the harmonic regime, which can be prone to destabilization due to delayed optical feedback and competition between the two different operating modes of the laser. Such a configuration can favor operation in the harmonic comb regime and result in even more stable sources of sub-THz radiation.

Figure 9:
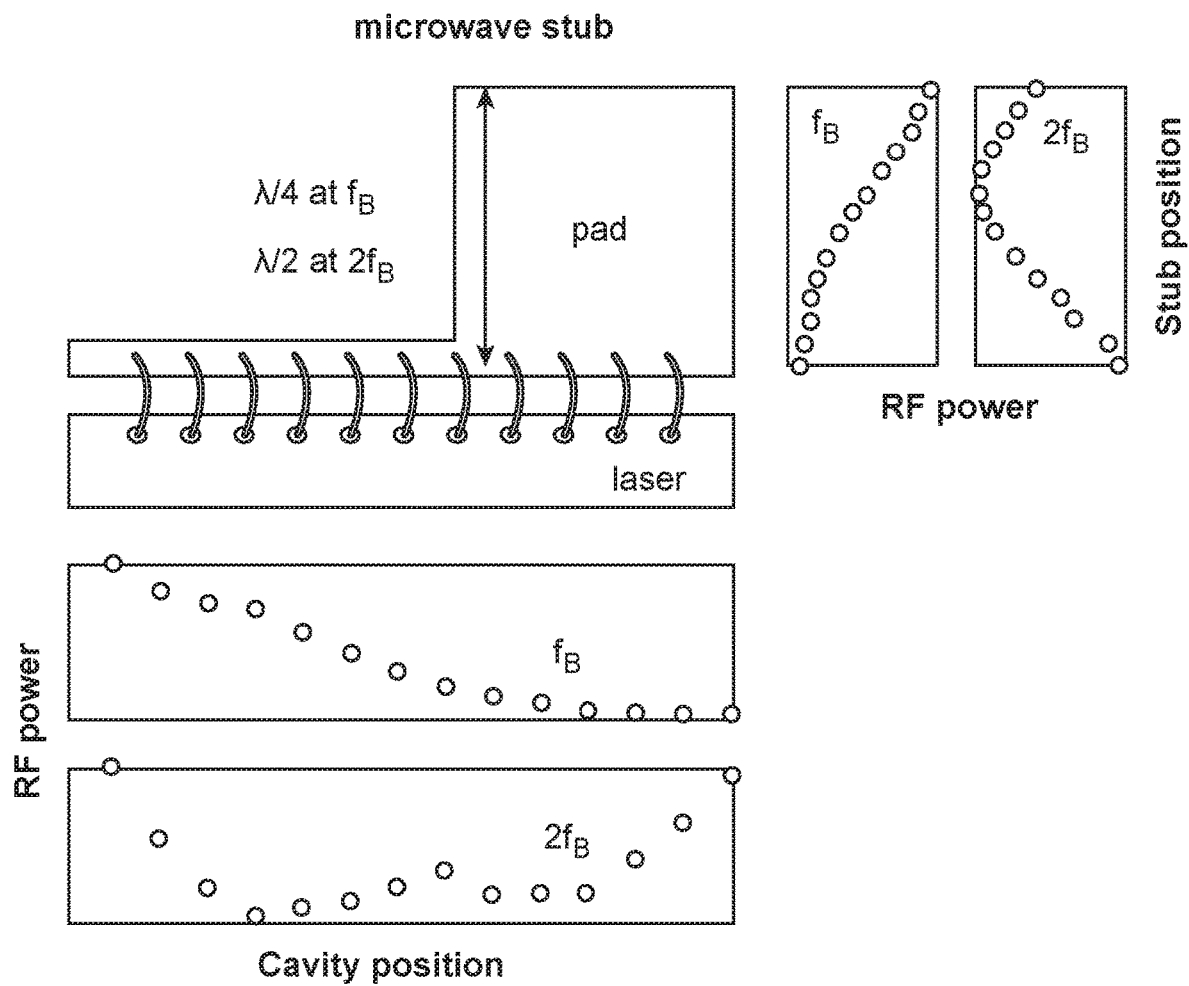
FIG. 9 illustrates a configuration that includes a pad disposed adjacent to a laser, in accordance with one or more embodiments.

FIG. 9 illustrates a configuration that includes a pad disposed adjacent to a laser, in accordance with one or more embodiments. FIG. 9 depicts a laser top contact and a laser cavity lying underneath, and a contact pad (e.g., a microwave stub), connected to the laser top contact via bond wires. In other embodiments, other connectors may be implemented. The depicted laser may be a Fabry-Perot laser. Fabry-Perot lasers can implement a geometry similar to microstrip transmission lines. In such devices, microwaves generated by the laser light can propagate in the structure (e.g. when the device provides for low radio frequency absorption) and can give rise to certain effects. The depicted embodiment involves a laser frequency comb with an asymmetric pad acting as a microwave $\lambda/4$ (one quarter of the wavelength of the intermode beatnote) stub at $f_B$ (the beatnote frequency), and as a $\lambda/2$ stub at $2f_B$. This contact geometry can cause a suppression of the beat note profile at $f_B$ in part of the cavity in a manner that does not induce an asymmetry at $2f_B$, as may be the case for certain comparative techniques that implement a microwave stub. Such an effect may have a back-action on the frequency comb formation, disfavoring fundamental frequency combs spaced by $f_B$ and promoting harmonic frequency combs spaced by a multiple of $f_B$, which can be supported in devices with contacts implemented in the depicted configuration.

The beatnote (with frequency $f_B$) inside a symmetric or substantially symmetric cavity with a symmetric or substantially symmetric contact pad nearby or adjacent to the cavity can have a symmetric or substantially symmetric configuration, such as shown, for example, in FIG. 5. When the contact is shaped as depicted here in FIG. 9 such that a portion of the contact extends laterally to at least to a width of about $\lambda/4$ (e.g., to a width of at about $\lambda/4$), the beatnote can propagate laterally into the pad, undergo reflection at the end of the pad and propagate back to re-enter the laser with a phase difference of about $\pi$. This can cause destructive interference between the beatnote generated inside the laser and the reflected part from the microwave stub, which can lead to the local suppression of the beatnote (e.g., the power may be approximately equal to zero inside the laser next to the stub). The pattern may remain unaffected in the part of the laser that does not lie opposite to the quarter wavelength transmission line. As discussed herein, the optical modes inside the laser can beat to produce symmetric oscillatory patterns at microwave frequencies and the latter can act back on the optical field to sustain phase-locking and comb operation. Breaking the symmetry of the pattern can have consequences on the optical frequency comb field. For example, the laser can be modeled as possessing at least two competing mechanism responsible for formation of different microwave patterns and as preferring to switch to a state where no competition and no symmetry breaking occurs. Such a state is the harmonic state, where few or substantially no beatnotes at low frequencies are generated.

Figure 10:
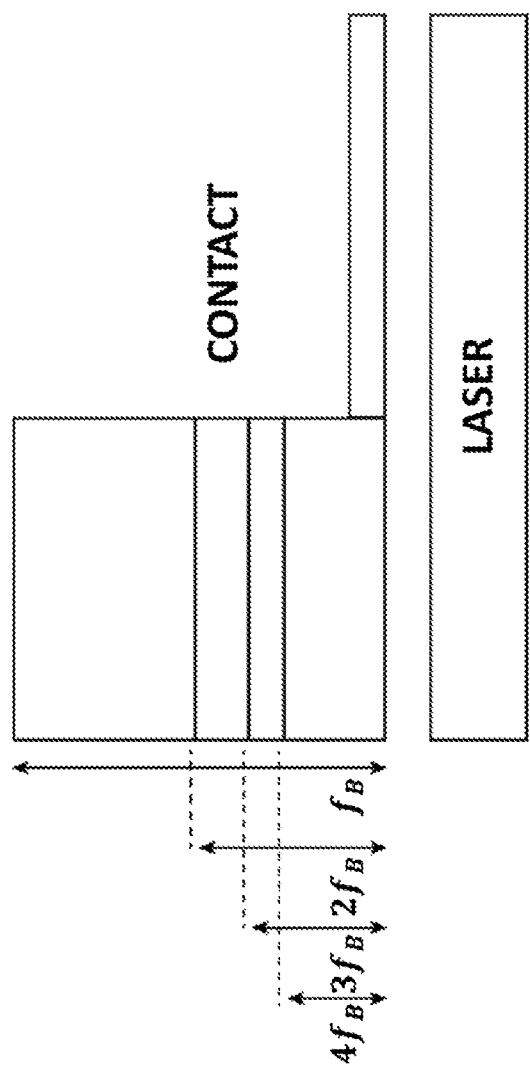
FIG. 10 illustrates a configuration that includes a stub disposed adjacent to a laser, in accordance with one or more embodiments

FIG. 9 shows how the fundamental beatnote pattern inside a symmetric cavity (e.g., with no facet coatings) in the presence of a microwave stub shows a strong attenuation towards the end of the laser, where the pad has a width of $\lambda/4$, which may be ascribed the effect discussed above. The beatnote pattern at the second harmonic of the fundamental ($2f_B$) shows a pattern similar to that observed in a device where contact engineering was omitted (see FIG. 5). This may be due to the fact that the effective length of the stub at the wavelength of the second harmonic is about $\lambda/2$ and the second harmonic that has travelled laterally through the transmission line and back interferes in-phase with the second harmonic of the beatnote generated inside the laser. In some embodiments, by using a pad of half the depicted length can suppress the second harmonic in the same fashion as the fundamental. The plots to the right of the depicted microwave stub show the mapped intensity pattern of the microwave across the stub at both fundamental $f_B$ and the second harmonic $2f_B$ frequencies. This shows that the stub can act as a quarter- and half-wave transmission line at the corresponding frequencies. One, two, or more of orders of the beatnote may be suppressed in a similar manner. Breaking the symmetry of the fundamental beatnote is enough to cause more rigid operation in the harmonic frequency comb regime. However, patterning the contact pad in such a way that it possesses microwave quarter wavelength lines at multiple beatnote orders may provide for breaking the symmetry of the respective orders. This effect is illustrated in FIG. 10, which illustrates a configuration that includes a stub disposed adjacent to a laser, in accordance with one or more embodiments.

Wireless Injection Locking

Some embodiments provide for wirelessly injection locking the intermodal beatnote of the laser frequency comb. The locking signal may be derived from an appropriate frequency generator and may be picked up by a resonant antenna integrated in a laser. The laser operates in a frequency comb regime and generates an intermodal beatnote at frequency $f_0$. The frequency of an externally generated signal lies close to the beatnote frequency, and at a certain power level or frequency detuning the laser beatnote becomes locked to the reference source in a master-slave fashion. This configuration for injection locking is, in some cases, an improvement over comparative techniques that do not injection lock in a wireless fashion. For example, the wireless injection locking may be advantageous when it comes to compact design and packaging of the laser frequency comb.

Figure 11:
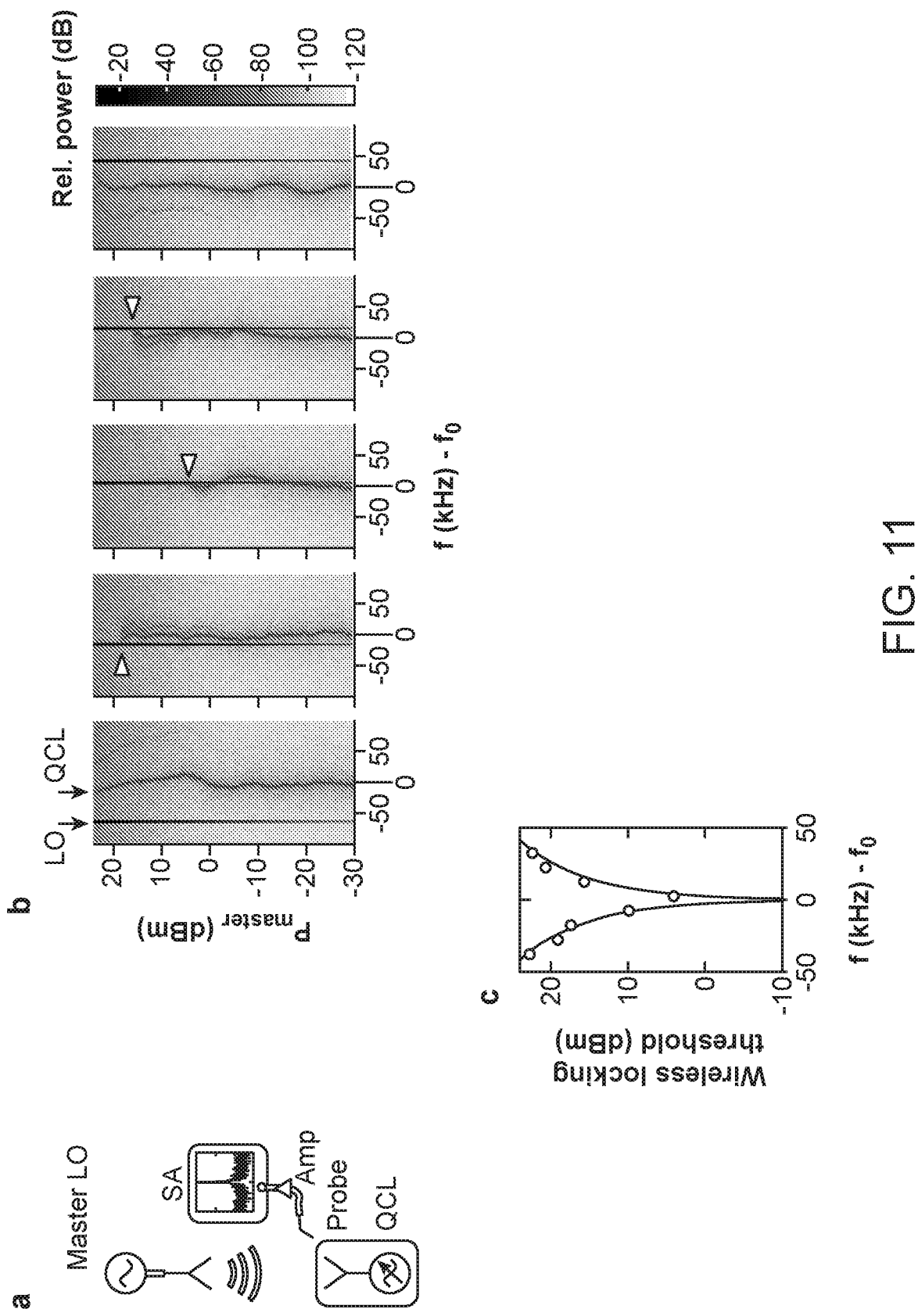
FIG. 11 illustrates a configuration for wireless injection locking, in accordance with one or more embodiments.

FIG. 11 illustrates a configuration for wireless injection locking, in accordance with one or more embodiments. Part a of FIG. 11 shows a schematic of a set-up for injection locking the QCL beat note to a local oscillator (LO) through free space. A probe placed near an antenna of a QCL monitors changes in the laser beat note induced by the LO. Part b of FIG. 11 illustrates a shift of a QCL beat note spectrum, in accordance with one or more embodiments. Part b of FIG. 11 shows a shift of the QCL beat note spectrum as the power of the LO is swept between about −30 and about 24 dBm. The LO power threshold at which locking occurs is marked by arrowheads. Frequencies are given with respect to the beat note frequency of the free-running QCL (f0=about 5.501 GHz). Five example cases are shown. Part c of FIG. 11 is a graph showing power corresponding to a threshold for wireless locking, in accordance with one or more embodiments. Part c of FIG. 11 shows a measured LO power corresponding to the threshold for wireless locking of the QCL beat note to the LO for different LO frequencies (circles). Also shown is the fit of the theoretical quadratic dependence (continuous line).

Wireless injection locking of the laser beat may provide for remote control of laser frequency combs and may be implemented for wireless synchronization of multiple comb generators to a single reference oscillator, without integrating complex interconnected microwave architectures.

In some embodiments, the methods and systems described herein provide for a sub-THz frequency source, which may be used in applications using such a source. This includes medical imaging and security applications, such as applications that use sub-THz radiation that penetrates tissues (e.g., without ionization, as opposed to X-Ray) and fabrics and plastics.

As used herein, the singular terms "a," "an," and "the" may include plural referents unless the context clearly dictates otherwise.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device comprising:
    a quantum cascade laser (QCL) configured to generate a terahertz (THz) or microwave carrier signal based on intracavity beating of laser optical frequency modes of the QCL, the QCL comprising:
        a laser waveguide,
        a laser optical gain medium incorporated in the laser waveguide, and
        at least one electrode configured to receive an input baseband signal,
        wherein the QCL is further configured to couple the THz or microwave carrier signal and the input baseband signal into a THz or microwave communication signal; and
    wherein the electronic device further comprises an antenna configured to transmit the THz or microwave communication signal.

2. An electronic device, comprising:
    an antenna configured to receive a terahertz (THz) or microwave communication signal; and
    a quantum cascade laser (QCL) configured to generate a THz or microwave carrier signal and to de-couple the THz or microwave communication signal from the THz or microwave carrier signal into an output baseband signal, the QCL comprising:
        a laser waveguide,
        a laser optical gain medium incorporated in the laser waveguide, and
        at least one electrode configured to output the output baseband signal.

3. The electronic device of claim 2, wherein the QCL is configured to operate in a harmonically-phase-locked regime or in a fundamentally-phase-locked regime.

4. The electronic device of claim 2, wherein the THz or microwave carrier signal includes laser optical frequency modes equidistantly spaced and separated by a frequency spacing.

5. The electronic device of claim 4, wherein the laser optical frequency modes are mid-infrared harmonic frequency combs.

6. The electronic device of claim 4, wherein the frequency spacing corresponds to a higher harmonic of a free spectral range (FSR) of the QCL.

7. The electronic device of claim 2, wherein the laser waveguide and the laser optical gain medium of the QCL define a Fabry-Perot laser cavity.

8. The electronic device of claim 2, wherein the antenna is a phase-array antenna integrated with the electrode of the QCL.

9. The electronic device of claim 2, wherein the QCL further comprises at least one facet optical coating.

10. The electronic device of claim 2, further comprising a laser control unit configured to control operation of the QCL.

11. A communication system, comprising:
    a transmitter device, comprising:
        a first quantum cascade laser (QCL) configured to generate a first THz or microwave carrier signal, the first QCL comprising a first electrode configured to receive an input baseband signal, wherein the first QCL is further configured to couple the first THz or microwave carrier signal and the input baseband signal into a THz or microwave communication signal; and a first antenna configured to transmit the THz or microwave communication signal; and a receiver device, comprising:

a second antenna configured to receive the THz or microwave communication signal; and a second QCL configured to generate a second THz or microwave carrier signal and to de-couple the THz or microwave communication signal from the second THz or microwave carrier signal into an output baseband signal, the QCL comprising a second electrode configured to output the output baseband signal.

12. The communication system of claim 11, wherein the first QCL or the second QCL is configured to operate in a harmonically-phase-locked regime or in a fundamentally-phase-locked regime.

13. The communication system of claim 11, wherein the first or the second THz or microwave carrier signal includes mid-infrared harmonic frequency combs that are equidistantly spaced by a frequency spacing corresponding to a higher harmonic of a free spectral range (FSR) of the first or the second QCL.

14. The communication system of claim 11, wherein a first frequency spacing of the first THz or microwave carrier signal is substantially equal to a second frequency spacing of the second THz or microwave carrier signal.

15. The communication system of claim 11, wherein the first or the second antenna is a phase-array antenna integrated with the first or the second electrode of the first or the second QCL.

* * * * *